(12) United States Patent
Wheat et al.

(10) Patent No.: US 7,429,403 B2
(45) Date of Patent: Sep. 30, 2008

(54) GAS DISTRIBUTOR FOR VAPOR COATING METHOD AND CONTAINER

(75) Inventors: Gary E. Wheat, Madisonville, KY (US); Terri K. Brown, Central City, KY (US); Richard L. Schmidt, Marblehead, MA (US); Edward J. Cove, Middleton, MA (US)

(73) Assignee: General Electric Company, Schenectady, NY (US)

( * ) Notice: Subject to any disclaimer, the term of this patent is extended or adjusted under 35 U.S.C. 154(b) by 367 days.

(21) Appl. No.: 11/203,185

(22) Filed: Aug. 15, 2005

(65) Prior Publication Data

US 2005/0287298 A1    Dec. 29, 2005

Related U.S. Application Data

(60) Continuation of application No. 10/671,193, filed on Sep. 25, 2003, now abandoned, which is a division of application No. 10/029,311, filed on Dec. 20, 2001, now Pat. No. 6,986,814.

(51) Int. Cl.
*C23C 16/00* (2006.01)

(52) U.S. Cl. .................. 427/250; 427/251; 427/252; 427/253; 427/248.1

(58) Field of Classification Search .......... 427/250–253
See application file for complete search history.

(56) References Cited

U.S. PATENT DOCUMENTS

| | | | |
|---|---|---|---|
| 3,778,298 A | 12/1973 | Kanetake et al. | |
| 3,958,047 A | 5/1976 | Baldi | |
| 4,148,275 A | 4/1979 | Benden et al. | |
| 5,264,245 A | 11/1993 | Punola et al. | |
| 5,368,888 A | 11/1994 | Rigney | |
| 5,455,071 A * | 10/1995 | Pillhoefer et al. | 427/253 |
| 5,462,013 A | 10/1995 | Punola et al. | |
| 5,928,725 A | 7/1999 | Howard et al. | |
| 6,039,810 A | 3/2000 | Mantkowski et al. | |
| 6,183,811 B1 | 2/2001 | Conner | |
| 6,203,851 B1 | 3/2001 | Walter | |
| 6,207,233 B1 | 3/2001 | Perry et al. | |
| 6,224,941 B1 | 5/2001 | Chen et al. | |
| 6,273,678 B1 | 8/2001 | Darolia | |
| 6,450,117 B1 * | 9/2002 | Murugesh et al. | 118/723 ME |
| 6,911,234 B2 * | 6/2005 | Warnes et al. | 427/248.1 |

FOREIGN PATENT DOCUMENTS

| | | |
|---|---|---|
| JP | 57138128 | 8/1982 |
| JP | 61054617 | 3/1986 |
| JP | 03277325 | 12/1991 |
| JP | 09213648 | 8/1997 |

\* cited by examiner

*Primary Examiner*—Timothy Meeks
*Assistant Examiner*—David Turocy
(74) *Attorney, Agent, or Firm*—William Scott Andes; Gary M. Hartman; Domenica N. S. Hartman

(57) ABSTRACT

A method for introducing an inert carrier gas into a coating container used to provide a metallic coating on articles. The method includes introducing the inert carrier gas into the coating container as a plurality of carrier gas streams proximate the top of the coating container. The carrier gas streams are formed and introduced into the coating container before encountering a source material for the metallic coating, and each carrier gas stream is introduced so that the inert carrier gas at least initially moves within the coating container in a circular swirling fashion above and before encountering the source material and the article.

20 Claims, 4 Drawing Sheets

GAS DISTRIBUTOR FOR VAPOR COATING METHOD AND CONTAINER

CROSS-REFERENCE TO RELATED APPLICATIONS

This application is a continuation of U.S. application Ser. No. 10/671,193, filed Sep. 25, 2003, now abandoned which is a divisional of U.S. application Ser. No. 10/029,311, filed Dec. 20, 2001 now U.S. Pat. No. 6,986,814.

BACKGROUND OF THE INVENTION

The present invention relates generally to a gas distributor useful for a vapor coating method and container. The present invention particularly relates to a gas distributor for introducing nonoxidizing or inert carrier gases for vapor coating of articles such as gas turbine engine blades with a metallic coating, especially an aluminide coating.

Certain articles operating at elevated temperatures in an oxidizing atmosphere have been provided with environmental protection in the form of coatings of various types. For example, components such as gas turbine engine turbine blades, vanes and other airfoils operating at high temperatures typically experienced in the turbine section of the engine frequently include metallic surface coatings alone or in various combinations with other materials. Such coatings are capable of resisting the oxidation, corrosion and sulfidation conditions generated during high temperature operation.

Application methods for such metallic coatings include depositing a vapor of one or more protective metals, for example aluminum or alloys of aluminum, to provide a form of aluminide coating, on an article surface at high temperatures. Such vapor coating methods are typically conducted in a nonoxidizing or inert atmosphere (e.g. hydrogen, nitrogen, helium or argon) within a coating container or chamber commonly referred to as a "retort". Generally, the article or more typically articles (e.g., airfoils such as turbine blades) to be coated are placed within the container, along with a source of the aluminide coating, typically in the form of metallic pellets or powder, and is often retained in perforated baskets that can be arranged in rows to surround the articles. The container is then placed within a heater such as a furnace to generate a coating vapor. Generation of the coating vapor typically includes the use of halide "activators" such as fluorides, chlorides or bromides. This halide activator can be in the form of a gas that is introduced into the container to react with the source of the aluminide coating to form the aluminide-bearing gas or can be generated from a halide activator source within the container that forms the reactive halide gas upon heating.

The aluminide-bearing gas is typically transported or moved within the coating container by a nonoxidizing or inert carrier gas (e.g., hydrogen, nitrogen, helium or argon). In some vapor coating systems, this carrier gas is introduced through the bottom of the container and carries the aluminide-bearing gas upwardly to coat the articles. See, for example, U.S. Pat. No. 4,148,275 (Benden et al), issued Apr. 10, 1979; U.S. Pat. No. 5,928,725 (Howard et al), issued Jul. 27, 1999. In other vapor coating systems, the carrier gas is introduced through the top of the coating container and then diffuses throughout the container to carry the aluminide-bearing gas and coat the articles. See U.S. Pat. No. 6,039,810 (Mantkowski et al), issued Mar. 21, 2000. The advantage in introducing a carrier gas, such as argon, at the top (versus the bottom) of the container is that argon, being denser and heavier than air, will naturally flow downwardly through the container to commingle with the metallic (aluminide) coating vapor and will also act as a "plunger" to aid in the internal coating of the articles.

In one such system where the carrier gas is introduced through the top of the container, a gas distributor is used to disperse the carrier gas. One such gas distributor has a configuration similar to that of a "shower head" in that it is provided with a plurality of gas outlet holes spaced along the periphery of the cylindrical or disk-shaped head through which the carrier gas exits. This "shower head" distributor is typically positioned at the top of the container and above the aluminide generating pellets and articles to be coated.

It has been found that when a carrier gas such as argon is introduced through such a "shower head" distributor at the top of the container, the aluminide-bearing gas is not consistently moved or mixed within the coating container. This is particularly true as the argon gas moves and diffuses through the rows of aluminide generating pellets and through the rows of articles (e.g., airfoils) to be coated. Because the rows of pellets and articles impede or resist the gas flow, regions having varying densities of aluminide-bearing gas can be formed, thus creating a nonhomogeneous environment of the aluminide-bearing gas surrounding the articles to be coated. This nonhomogeneous environment of the aluminide-bearing gas usually results in an inconsistent distribution of the aluminide coating on the exterior of the article, as well as inconsistent internal gas flow and coating of the interior surface of the article (e.g. hollow airfoils such as hollow gas turbine blades).

Accordingly, it would be desirable to be able to provide a gas distributor that can introduce the carrier gas in a manner such that the aluminide-bearing gas is consistently moved and mixed within the coating container such that a more uniform and consistent aluminide coating is provided on the exterior of the articles, as well as on the interior of hollow articles.

SUMMARY OF THE INVENTION

The present invention relates to a gas distributor suitable for introducing a carrier gas at the top of a coating container used to provide a metallic coating on articles. This gas distributor comprises:
  (a) a gas inlet;
  (b) a gas outlet head in communication with the gas inlet for receiving a flow of gas from the gas inlet and having a peripheral surface;
  (c) a plurality of gas outlets spaced along the peripheral surface, the gas flow exiting as a gas stream from each gas outlet;
  (d) a plurality of gas deflectors, each deflector being proximate to one of the gas outlets and at least initially directing the gas stream exiting each gas outlet in at least a generally centripetal path.

The present invention also relates to an apparatus for vapor coating of articles with a metallic coating. This apparatus comprises;
  (1) a coating container having a base, a top spaced from the base, and a side wall connecting the top and the base;
  (2) the gas distributor previously described for introducing a carrier gas into the coating container positioned such that the gas outlet head is proximate the top of the coating container;
  (3) at least one holder for each article to be coated positioned within the coating container and below the gas outlet head of the gas distributor;

(4) at least one holder for the source of the metallic coating positioned within the coating container and below the gas outlet head of the gas distributor.

The present invention also relates to a method for introducing the carrier gas into the coating container for vapor coating of articles with a metallic coating. This method comprises the step of introducing the carrier gas as a plurality of carrier gas streams proximate the top of the coating container, each carrier gas stream flowing at least initially in at least a generally centripetal path.

The present invention further relates to a method for coating the articles with a metallic coating in the coating container. This method comprises the steps of:
(a) loading the coating chamber of the container with articles to be coated;
(b) loading the coating chamber of the container with a source of a metallic coating;
(c) introducing an inert carrier gas as a plurality of inert carrier gas streams proximate the top of the coating chamber of the loaded coating container, each carrier gas stream flowing at least initially in a curved generally centripetal, downward path to provide an inert gas atmosphere in the coating chamber of the loaded container;
(d) after the inert gas atmosphere is provided in the coating chamber, heating the loaded coating container to a temperature sufficient to form a metallic coating gas from the metallic coating source;
(e) continuing the flow of the carrier gas into the coating chamber of the loaded container to move the metallic coating gas within the coating chamber of the loaded container so as to deposit a coating on the articles.

The gas distributor and vapor coating apparatus, as well as the method for introducing the carrier gas, and method for coating the articles, of the present invention provides a number of significant benefits, especially when introducing the carrier gas at or proximate the top of a coating container for vapor coating of articles with a metallic coating. Because the carrier gas (e.g., argon) is introduced into the top of the coating container at least initially in at least a generally centripetal path, this carrier gas tends to move in circular or swirling fashion and thus keeps the environment above the articles to be coated more uniform and homogeneous. As a result, the environment of the metallic coating (e.g., aluminide)-bearing gas surrounding the articles tends to be more uniform and homogenous, thus leading to a more uniform metallic coating on the exterior surface of the articles. In addition, in the case of hollow articles, such as airfoils, there will be a more uniform distribution of gas flow internally, resulting in a more uniform metallic coating on the interior surface of the articles.

DETAILED DESCRIPTION OF THE INVENTION

Figure 1:
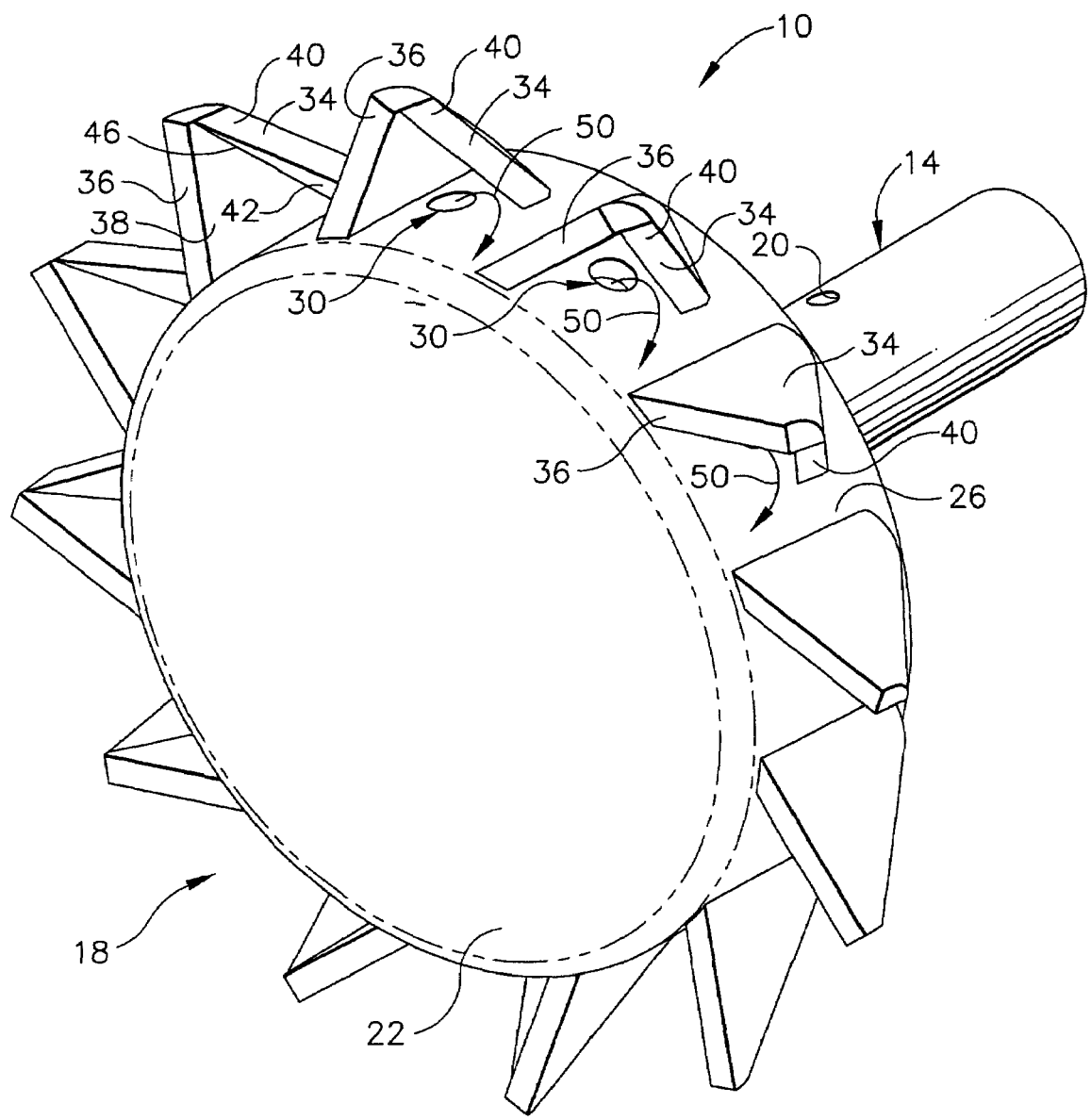
FIG. 1 is perspective view of an embodiment of the gas distributor of the present invention is useful.
Figure 2:
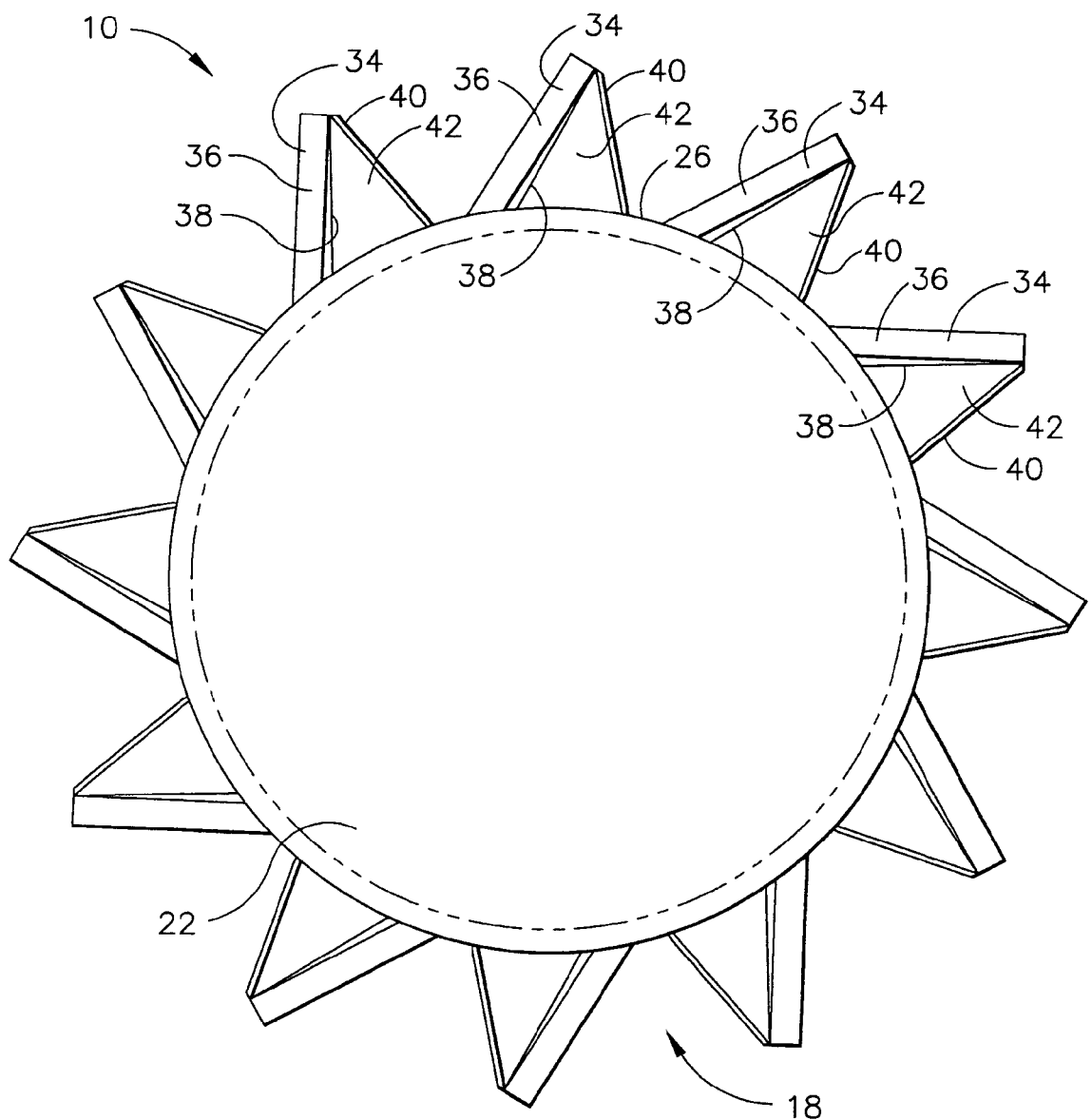
FIG. 2 is bottom view of the distributor of FIG. 1

Referring to the drawings, FIGS. 1 and 2 show an embodiment of the gas distributor indicated generally as 10. Distributor 10 comprises a generally cylindrical hollow gas inlet tube or pipe 14 for receiving the gas from a source of supply (not shown) and a generally cylindrical or disk-shaped gas outlet head or manifold indicated as 18 connected to pipe 14. As shown in FIG. 1, pipe 14 is provided with a hole indicated as 20 for securing the source of the gas to pipe 14. Although not shown, manifold 18 is also hollow so that as gas is fed into pipe 14, this gas is then delivered to manifold 18, i.e., pipe 14 is in fluid communication with manifold 18.

Referring especially to FIG. 1, manifold 18 comprises a bottom surface indicated as 22 and is shown as having a generally circular peripheral surface indicated as 26. However, peripheral surface 26 can have other shapes or configurations, including polygonal shapes or configurations (e.g., hexagonal, octagonal, decagonal, dodecagonal, etc.) A plurality of gas outlets in the form of apertures or holes 30 are formed in and spaced along peripheral surface 26. The number of holes 30 can vary depending on the size of the holes and the size of peripheral surface 26. Usually, the number of holes 30 along peripheral surface 26 is at least 4, and is typically in the range of from 4 to 20, and more typically in the range of from 6 to 12.

Proximate each of the holes 30 is an angular gas baffle or deflector 34 which is shown in FIG. 1 as having an open generally trapezoidal or "hooded" configuration or shape. However, deflectors 34 can also be formed to have other configurations or shapes (e.g., rounded). Each deflector 34 is shown as comprising a generally triangular aft deflector component 36 having a generally forward deflecting inner surface 38 and a generally triangular upper deflector component 40 having a generally downward deflecting inner surface 42. Surfaces 38 and 42 of components 36 and 40 intersect along a seam or edge 46. As shown in FIG. 1, as the gas flow or stream exits each hole 30, it is at least initially deflected by inner surface of 38 (of component 36) into a generally centripetal path (i.e., along or parallel to surface 26) and by inner surface 42 (of components 40) into a slightly downward path (i.e., eventually away from bottom surface 22). As a result, the gas stream exiting from holes 30 moves into a curved generally centripetal, slightly downward path, as indicated by arrows 50.

Figure 3:
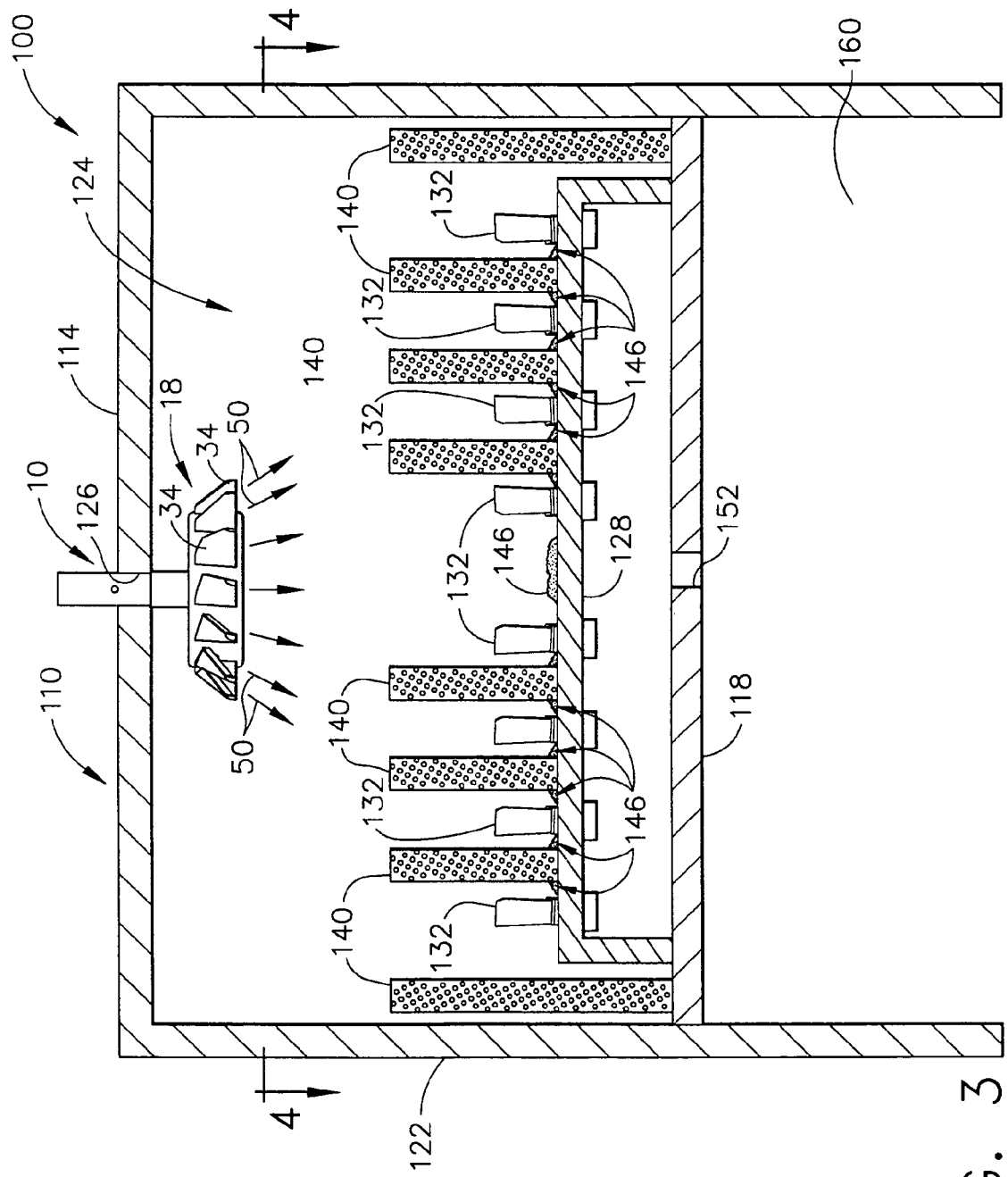
FIG. 3 is sectional side view of an embodiment of a vapor coating apparatus using the distributor of FIG. 1.

As shown in FIG. 3, gas distributor 10 is typically used with a vapor coating apparatus indicated generally as 100 that includes a generally cylindrical coating container indicated as 110. As shown in FIG. 3, distributor 10 (including pipe and manifold 18) is sized to fit within container 110. Container 110 has a top or lid indicated as 114, a base indicated as 118 spaced from lid 114, and a generally cylindrical circumferential side wall indicated as 122 that connects lid 110 and base 118 and extends downwardly beyond base 118. Lid 114, base 118 and side wall 122 of container 110 define an interior coating chamber indicated as 124. As also shown in FIG. 3, pipe 14 of distributor 10 is inserted partially through a hole or aperture 126 at or proximate the center of lid 114; manifold 18 is positioned within chamber 124 at or proximate the top thereof, i.e., proximate lid 114.

Figure 4:
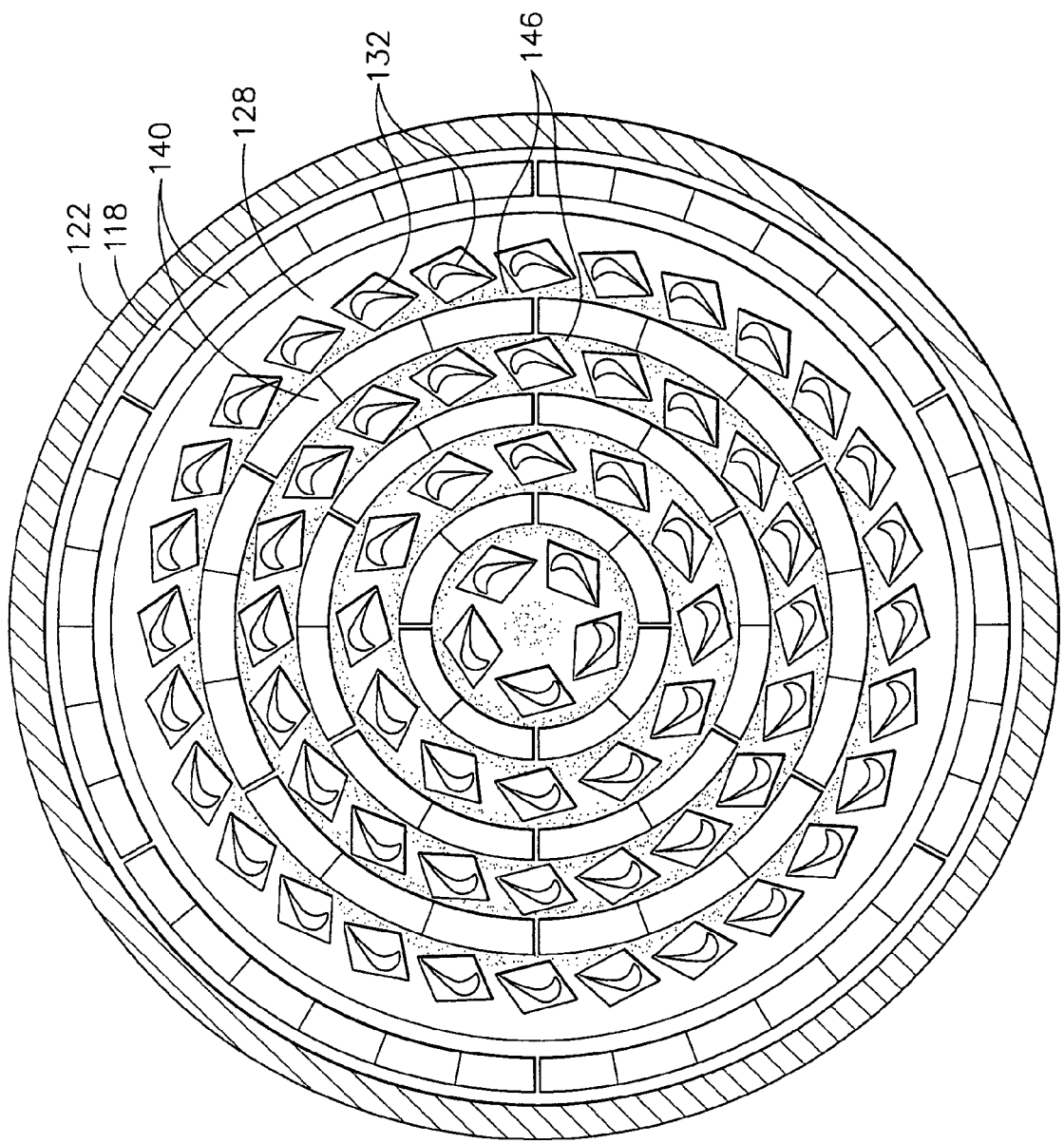
FIG. 4 is a sectional view taken along line 4-4 of FIG. 3.

Apparatus 100 also has an article support or holder 128 attached to or otherwise associated with base 118 of container 110 that is provided with apertures, typically in the form of slots (not shown) or other suitable devices, for receiving and holding articles such as airfoils (e.g., turbine blades) 132 to be coated. Apparatus 100 also has holders in the form of perforated baskets indicated as 140 positioned within container 110 for receiving or holding pellets of the metallic coating. As shown in FIG. 3, baskets 140 and articles 132 are below manifold 18 of distributor 10. The number and spacing of baskets 140 and articles 132 can be varied depending upon the internal dimensions and configuration of container 110, the size of articles 132 to be coated and like factors known to those skilled in the art. A representative arrangement is shown in FIG. 4, where articles 132 and baskets 140 are arranged in alternating concentric rows or circles. The spacing of the rows of articles 132 and baskets 140 should be such as to allow the free flow of gas therebetween. Between each row of articles 132 and baskets 140 is typically placed discrete portions of a powdered halide activator indicated generally as 146. This powdered halide activator is typically placed so as not to touch or be in contact with articles 132 or baskets 140.

In order to coat hollow articles 132 (e.g., airfoils such as turbine blades), having internal surfaces and passageways in predetermined locations with the aluminide coating, it may be necessary to mask those areas not requiring any coating. After loading holder 128 with the articles 132, the container 110 and its contents, which also contains a metallic coating source (e.g., aluminum pellets) loaded into baskets 140, is sealed and then loaded into a furnace or other heating device. Gas inlet pipe 14 is then connected to as source of a nonoxidizing or inert carrier gas such as hydrogen, nitrogen, helium, or argon.

After loading the container 110 into a furnace or other heating device, interior chamber 124 is purged of air by introducing the nonoxidizing or inert carrier gas through gas inlet pipe 14 which then flows into manifold 18 and exits through gas outlets 30 as gas streams 50 so as to provide an inert gas atmosphere. The rate at which the carrier gas flows into pipe 14 (and out of holes 30 as gas streams 50) of manifold 18 is usually at least about 15 ft$^3$/hour (about 425 liters$^3$/hour), and is typically in the range of from about 15 to about 120 ft$^3$/hour (from about 425 to about 3,398 liters$^3$/hour), and more typically from about 40 to about 70 ft$^3$/hour (from about 1133 to about 1982 liters$^3$/hour). As the gas exits outlets 30, each of gas streams 50 are directed by deflectors 34 into a curved generally centripetal, slightly downward path so that the inert carrier gas swirls above the concentric rows of baskets 140 and articles 132, thus creating a relatively uniform and homogeneous atmosphere in chamber 124. In addition, the pressure of the gas flow forces the streams 50 of the carrier gas downwardly from distributor 10 and around and through the rows of baskets 140 and articles 132.

When this inert gas atmosphere is provided or established, container 110 is usually heated to an elevated, preselected temperature, of at least about 1000° F. (about 538° C.), typically in the range from about 10000 to about 2200° F. (from about 5380 to about 1204° C.), and more typically in the range of from about 1900° to about 2000° F. (from about 1038° to about 1093° C.). The particular elevated temperature selected will depend on the coating application parameters desired (including the source of metallic coating used) and other factors that would be understood by those skilled in the art. Upon reaching this preselected temperature, the powdered activator 146 will form a reactive halide gas. Suitable halide activators can be selected from aluminum chloride, aluminum fluoride, ammonium fluoride and mixtures thereof. This reactive halide gas flows through the pellets in baskets 140 containing the metallic coating source (e.g., aluminum source) and reacts with the aluminum source to provide the metallic coating gas in the form of an aluminum halide or aluminide-bearing gas. The aluminum source can be any aluminum or aluminum alloy, for example, cobalt aluminum alloys (CoAl), iron aluminum alloys (FeAl), or chromium aluminum alloys (CrAl), typically in powder or pelletized form. As would be understood by those skilled in the art, the reaction kinetics controlling the rate of formation of the aluminide-bearing gas will be dependent on the temperature, as well as the rate at which the carrier gas is introduced into chamber 124 by distributor 10 which is the driving force (i.e., "plunger") for moving the aluminide-bearing gas within chamber 124, as well as amongst, around and through articles 132. This, in turn controls the rate of deposition of the coating upon articles 132 and hence the coating thickness.

As the aluminide-bearing gas flows over the surfaces of articles 132, as well as through the holes in articles 132, such air cooling holes (not shown) in the case of a hollow airfoil, the aluminide-bearing gas is reduced to aluminum, thereby coating the exterior surfaces of articles 132, as well as the interior surfaces of hollow articles 132. Of course, the rate and uniformity of deposition is greatly influenced by the uniformity of the aluminide-bearing gas environment in proximity to articles 132, which is in turn controlled by the rate at which the carrier gas is introduced into chamber 124 and mixes with the aluminide-bearing gas, as previously discussed.

In order to force the aluminide-bearing gas through the rows of articles 132, a certain minimum pressure of the carrier gas is required. This is typically achieved by having the carrier gas continue to flow into chamber 124 at the previously indicated flow rates through pipe 14. Thus, the carrier gas can not only be used to control the uniformity of the aluminide-bearing gas environment, and hence reduction of the aluminide-bearing gas at the surface (exterior and interior), but it can also be balanced to provide the necessary pressure to move and force the aluminide-bearing gas through the rows of articles 132 (and into the interior when articles 132 are hollow), thereby coating them. In particular, the inert carrier gas commingles and mixes with the aluminide-bearing gas and acts, in essence, as a "plunger" to aid in the coating of external (and internal) surfaces of articles 132. After passing through articles 132, the remaining aluminide-bearing gas is exhausted from chamber 124 through gas exhaust outlet indicated as 152 and into an open evacuation chamber or area indicated as 160 defined by the extension of side wall 122 beyond base 118. Upon completion of the coating operation to the desired coating thickness, container 110 can be removed from the furnace and cooled or optionally furnace cooled, while maintaining an inert gas atmosphere if desired.

While specific embodiments of the method of the present invention have been described, it will be apparent to those skilled in the art that various modifications thereto can be made without departing from the spirit and scope of the present invention as defined in the appended claims.

What is claimed is:

1. A method for introducing a carrier gas into a coating container for vapor coating of at least one article with a metallic coating, the method comprising:

flowing a carrier gas into a gas outlet head having a peripheral surface;

causing the carrier gas to exit the gas outlet head and enter the coating container as multiple gas streams through a plurality of gas outlets spaced along the peripheral surface; and then deflecting the gas streams after exiting the gas outlets with a plurality of gas deflectors, each deflector deflecting a corresponding one of the gas streams exiting a corresponding one of the gas outlets prior to the gas stream encountering a source material for the metallic coating.

2. A method for introducing an inert carrier gas into a coating container for vapor coating of at least one article with a metallic coating, the coating container having a base, a top spaced from the base, and a side wall connecting the top and the base, the method comprising the step of introducing the inert carrier gas into the coating container as a plurality of carrier gas streams proximate the top of the coating container, the carrier gas streams being formed and introduced into the coating container before encountering a source material for the metallic coating, each carrier gas stream being introduced so that the inert carrier gas at least initially moves within the coating container in a circular swirling fashion above and before encountering the source material and the article.

3. The method of claim 2 wherein each carrier gas stream is individually introduced into the coating container through an opening in a surface and then deflected after exiting the opening and prior to encountering the source material.

4. The method of claim 3 wherein the inert carrier gas is introduced at a gas flow rate of at least about 15 ft$^3$/hour (about 425 liters$^3$/hour).

5. The method of claim 4 wherein the gas flow rate is in the range of from about 15 to about 120 ft$^3$/hour (from about 425 to about 3,398 liters$^3$/hour).

6. The method of claim 5 wherein the gas flow rate is in the range of from about 40 to about 70 ft$^3$/hour (from about 1133 to about 1982 liters$^3$/hour).

7. The method of claim 4 wherein the inert carrier gas is argon.

8. The method of claim 2 wherein each carrier gas stream is individually introduced into the coating container through an opening in a surface and then deflected in a direction approximately parallel to the surface prior to encountering the source material.

9. A method for coating an article with a metallic coating in a vapor coating container having a base, a top spaced from the base, and a side wall connecting the top and the base, the base, top and side wall defining a coating chamber, the method comprising the steps of:
   (a) loading the coating chamber of the container with at least one article to be coated;
   (b) loading the coating chamber of the loaded container with a source of a metallic coating;
   (c) introducing an inert carrier gas into the coating chamber as a plurality of inert carrier gas streams proximate the top of the loaded container, the carrier gas streams being formed and introduced into the coating chamber before encountering the source of the metallic coating, each carrier gas stream being deflected before encountering the source material so that the inert carrier gas at least initially moves within the coating chamber in a circular swirling fashion above and before encountering the source material and the article to provide an inert gas atmosphere in the coating chamber of the loaded container;
   (d) after the inert gas atmosphere is provided in the coating chamber of the loaded container, heating the loaded container to a temperature sufficient to form a metallic coating gas from the metallic coating source; and then
   (e) continuing the flow of the inert carrier gas into the coating chamber of the loaded container to move the metallic coating gas within the coating chamber of the loaded container so as to deposit a coating on the article.

10. The method of claim 9 wherein the article is an airfoil turbine blade, wherein the metallic coating source is an aluminum source and wherein the metallic coating gas is an aluminide-bearing gas.

11. The method of claim 10 which comprises the further step of loading the coating chamber of the container with a halide activator prior to step (d) and wherein the halide activator forms a reactive halide gas after heating during step (d) that reacts with the aluminum source to form the aluminide-bearing gas.

12. The method of claim 10 wherein the halide activator is selected from the group consisting of aluminum chloride, aluminum fluoride, ammonium fluoride and mixtures thereof.

13. The method of claim 11 wherein the inert carrier gas is introduced during step (e) into the coating chamber of the loaded container at a gas flow rate of at least about 15 ft$^3$/hour (about 425 liters$^3$/hour).

14. The method of claim 13 wherein the gas flow rate during step (e) is in the range of from about 15 to about 120 ft$^3$/hour (from about 425 to about 3,398 liters$^3$/hour).

15. The method of claim 14 wherein the gas flow rate during step (e) is in the range of from about 40 to about 70 ft$^3$/hour (from about 1133 to about 1982 liters$^3$/hour).

16. The method of claim 13 wherein the inert carrier gas is argon.

17. The method of claim 13 wherein the loaded container is heated during step (d) to a temperature of at least about 1000° F. (about 538° C.).

18. The method of claim 17 wherein the loaded container is heated during step (d) to a temperature in the range from about 1000° F. to about 2200° F. (from about 538° C. to about 1204° C.)

19. The method of claim 18 wherein the loaded container is heated during step (d) to a temperature in the range of from about 1900° F. to about 2000° F. (from about 1038° C. to about 1093° C.).

20. The method of claim 9 wherein each carrier gas stream is individually introduced into the coating container through an opening in a surface and then deflected in a direction approximately parallel to the surface prior to encountering the source material.

* * * * *